United States Patent
Nishiyama

(10) Patent No.: US 7,319,573 B2
(45) Date of Patent: Jan. 15, 2008

(54) MAGNETIC DISK DRIVE HAVING A SUSPENSION MOUNTED TRANSMISSION LINE INCLUDING READ AND WRITE CONDUCTORS AND A LOWER CONDUCTOR

(75) Inventor: Nobumasa Nishiyama, Yokohama (JP)

(73) Assignee: Hitachi Global Storage Technologies Japan, Ltd., Odawara (JP)

( * ) Notice: Subject to any disclaimer, the term of this patent is extended or adjusted under 35 U.S.C. 154(b) by 509 days.

(21) Appl. No.: 10/870,573

(22) Filed: Jun. 16, 2004

(65) Prior Publication Data

US 2004/0252413 A1 Dec. 16, 2004

(30) Foreign Application Priority Data

Jun. 16, 2003 (JP) ............... 2003-170945

(51) Int. Cl.
*G11B 5/48* (2006.01)
(52) U.S. Cl. ............... 360/245.9; 360/245.8; 360/246
(58) Field of Classification Search ......... 360/245.8, 360/245.9, 246
See application file for complete search history.

(56) References Cited

U.S. PATENT DOCUMENTS

| | | | | |
|---|---|---|---|---|
| 5,608,591 | A * | 3/1997 | Klaassen | 360/245.9 |
| 6,700,748 | B1 * | 3/2004 | Cowles et al. | 360/245.9 |
| 6,735,052 | B2 * | 5/2004 | Dunn et al. | 360/245.9 |
| 6,757,137 | B1 * | 6/2004 | Mei | 360/245.7 |
| 6,785,094 | B2 * | 8/2004 | Arya et al. | 360/244.3 |
| 6,882,506 | B2 * | 4/2005 | Yamaoka et al. | 360/245.9 |
| 6,894,875 | B2 * | 5/2005 | Serizawa et al. | 360/264.2 |
| 6,942,817 | B2 * | 9/2005 | Yagi et al. | 216/57 |
| 6,943,302 | B2 * | 9/2005 | Kageyama et al. | 174/254 |
| 7,079,357 | B1 * | 7/2006 | Kulangara et al. | 360/245.9 |
| 2002/0181156 | A1 | 12/2002 | Shiraishi | |
| 2003/0043508 | A1 * | 3/2003 | Schulz et al. | 360/245.9 |
| 2003/0206376 | A1 * | 11/2003 | Erpelding et al. | 360/245.9 |
| 2004/0012889 | A1 * | 1/2004 | Hernandez et al. | 360/245.9 |

FOREIGN PATENT DOCUMENTS

| | | |
|---|---|---|
| JP | 08-264911 A | 10/1996 |
| JP | 2002-237016 A | 8/2002 |

\* cited by examiner

*Primary Examiner*—Jefferson Evans
(74) *Attorney, Agent, or Firm*—Townsend and Townsend and Crew LLP

(57) ABSTRACT

Embodiments of the invention provide a magnetic disk drive which has improved electrical properties owing to a reduction in the loss of transmission line, improved vibration properties owing to a reduction in the stiffness of wiring around the head, and a flat impedance in the transmission line. In one embodiment, a magnetic disk drive comprises a suspension; a magnetic head coupled with the suspension and configured to write and read information to and from a magnetic recording medium; and a transmission line disposed on the suspension to transmit writing and reading information to and from the magnetic head. The transmission line includes a writing line and a reading line, a lower conductor disposed underneath the writing line and the reading line, and an insulating layer interposed between the lower conductor and the writing and reading lines. The lower conductor comprises copper or copper-based alloy and has a thickness of substantially less than 25 μm, desirably about 2-12 μm, and more desirably about 5 μm.

14 Claims, 11 Drawing Sheets

(a)

(b)

(a)

(b)

(a)

(b)

21a(21b)
19 suspension
18 arm

21c(21d,21e,21f)
35 stainless steel layer (forming flexure)
19 suspension
18 arm

MAGNETIC DISK DRIVE HAVING A SUSPENSION MOUNTED TRANSMISSION LINE INCLUDING READ AND WRITE CONDUCTORS AND A LOWER CONDUCTOR

CROSS-REFERENCES TO RELATED APPLICATIONS

This application relates to and claims priority from Japanese Patent Application No. 2003-170945, filed on Jun. 16, 2003.

BACKGROUND OF THE INVENTION

The present invention relates to a magnetic disk drive and, more particularly, to a technology which is effectively applicable to the transmission line structure to be mounted on the suspension for transmission of writing-reading signals to and from the magnetic head. The magnetic disk drive which is designed to write and read a large quantity of data in a limited space within a short time needs a technology to increase the recording density, a technology to increase the rate of data transmission, and a technology to increase the frequency for writing and reading. There is a type of magnetic disk drive meeting these requirements in which the line for transmission of writing and reading signals to and from the magnetic head is formed by printing on the suspension. This transmission line is composed of a pair of conductors for writing and a pair of conductors for reading. The conductors of both the writing line and reading line have lower conductors, with an insulating layer interposed between them. In the conventional transmission line as mentioned above, the conductors for writing line and reading line are formed from copper which is about 15 µm thick, the lower conductors are formed from stainless steel which is about 25 µm thick, and the insulating layer is formed from polyimide resin which is about 10 µm thick.

According to Japanese Patent Laid-open No. 2002-237016, the transmission line is mounted on the suspension in such a way that the FPC (flexible printed circuit) constituting the transmission line has a sheet member closely attached to the back thereof, said sheet having a higher thermal conductivity than stainless steel from which the suspension is formed. This sheet member may be formed from aluminum as well as copper, and its maximum thickness is about 500 µm.

BRIEF SUMMARY OF THE INVENTION

Embodiments of the present invention provide a new technology is achievable in regards to the transmission line structure of the magnetic disk drive. The magnetic disk drive has improved electrical properties owing to a reduction in the loss of transmission line, improved vibration properties owing to a reduction in the stiffness of wiring around the head, and a flat impedance in the transmission line.

The results of the present inventors' research revealed the following about the structure of the transmission line of the magnetic disk drive. The conventional transmission line mentioned above poses a problem with a considerable transmission loss because it has the lower conductor of stainless steel formed under the conductors of the writing transmission line and the reading transmission line. The magnetic disk drive requires that the magnetic head have its nearby wiring reduced in rigidity so that it faithfully follows the surface configuration of the magnetic recording medium. However, if the copper sheet member (or the lower conductor) is as thick as 500 µm, as mentioned in Japanese Patent Laid-open No. 2002-237016, it is unlikely to be applied to the wiring near the head because of its high rigidity. If it is to be applied, the lower conductor should be shaved and mounted as one-layer wiring. However, such a wiring is incapable of impedance control and vulnerable to external noise.

In the conventional transmission line mentioned above, the lower conductor of stainless steel will have increased transmission loss if it is made thin enough to be applied to the wiring near the head. This phenomenon will be explained later. Thus, in the conventional transmission line based on the technology disclosed in Japanese Patent Laid-open No. 2002-237016, reducing loss in the transmission line is incompatible with reducing rigidity in wiring near the head. A solution to this problem is being sought.

In specific embodiments of the present invention, the magnetic disk drive has a magnetic head for writing and reading information to and from a magnetic recording medium, a transmission line for transmitting writing and reading information to and from the magnetic head, and a suspension on which the transmission line is mounted. The transmission line mounted on the suspension has the following features.

(1) The transmission line mounted on the suspension is composed of a pair of conductors as the writing line and a pair of conductors as the reading line, each of the writing line and reading line having a lower conductor formed thereunder, with an insulating layer interposed therebetween, and the lower conductor being formed from copper or copper-based alloy in a thickness of about 5 µm, and the insulating layer being formed from polyimide resin 5-10 µm thick and the lower conductor being electrically kept at the ground potential.

(2) In (1) mentioned above, the lower conductor has a stainless steel layer as a flexure formed thereunder integrally with the suspension.

(3) In (1) mentioned above, the lower conductor has a stainless steel layer as a flexure formed thereunder integrally with the suspension, with an insulating layer interposed therebetween.

In accordance with an aspect of the present invention, a magnetic disk drive comprises a suspension; a magnetic head coupled with the suspension and configured to write and read information to and from a magnetic recording medium; and a transmission line disposed on the suspension to transmit writing and reading information to and from the magnetic head. The transmission line includes a writing line and a reading line, a lower conductor disposed underneath the writing line and the reading line, and an insulating layer interposed between the lower conductor and the writing and reading lines. The lower conductor comprises copper or copper-based alloy and has a thickness of substantially less than 25 µm.

In some embodiments, the lower conductor has a thickness of about 2-12 µm, and more desirably about 5 µm. The writing line comprises a pair of conductors and the reading line comprises a pair of conductors. The transmission line is spaced from the lower conductor by about 5-10 µm. The insulating layer comprises polyimide resin and has a thickness of about 5-10 µm. The lower conductor is grounded.

In accordance with another aspect of the invention, a magnetic disk drive comprises a suspension; a magnetic head coupled with the suspension and configured to write and read information to and from a magnetic recording medium; and a transmission line disposed on the suspension to transmit writing and reading information to and from the magnetic head. The transmission line includes a writing line and a reading line, a lower conductor disposed underneath the writing line and the reading line, and an insulating layer interposed between the lower conductor and the writing and reading lines. The lower conductor comprises copper or copper-based alloy. A stainless steel layer is disposed under the lower conductor and coupled with the suspension.

In some embodiments, the stainless steel layer is formed as a flexure integrally with the suspension. The stainless steel layer is connected to the suspension by a weld point. The suspension, the stainless steel layer, and the lower conductor are grounded. An insulating layer is interposed between the lower conductor and the stainless steel layer.

DETAILED DESCRIPTION OF THE INVENTION

Figure 1:
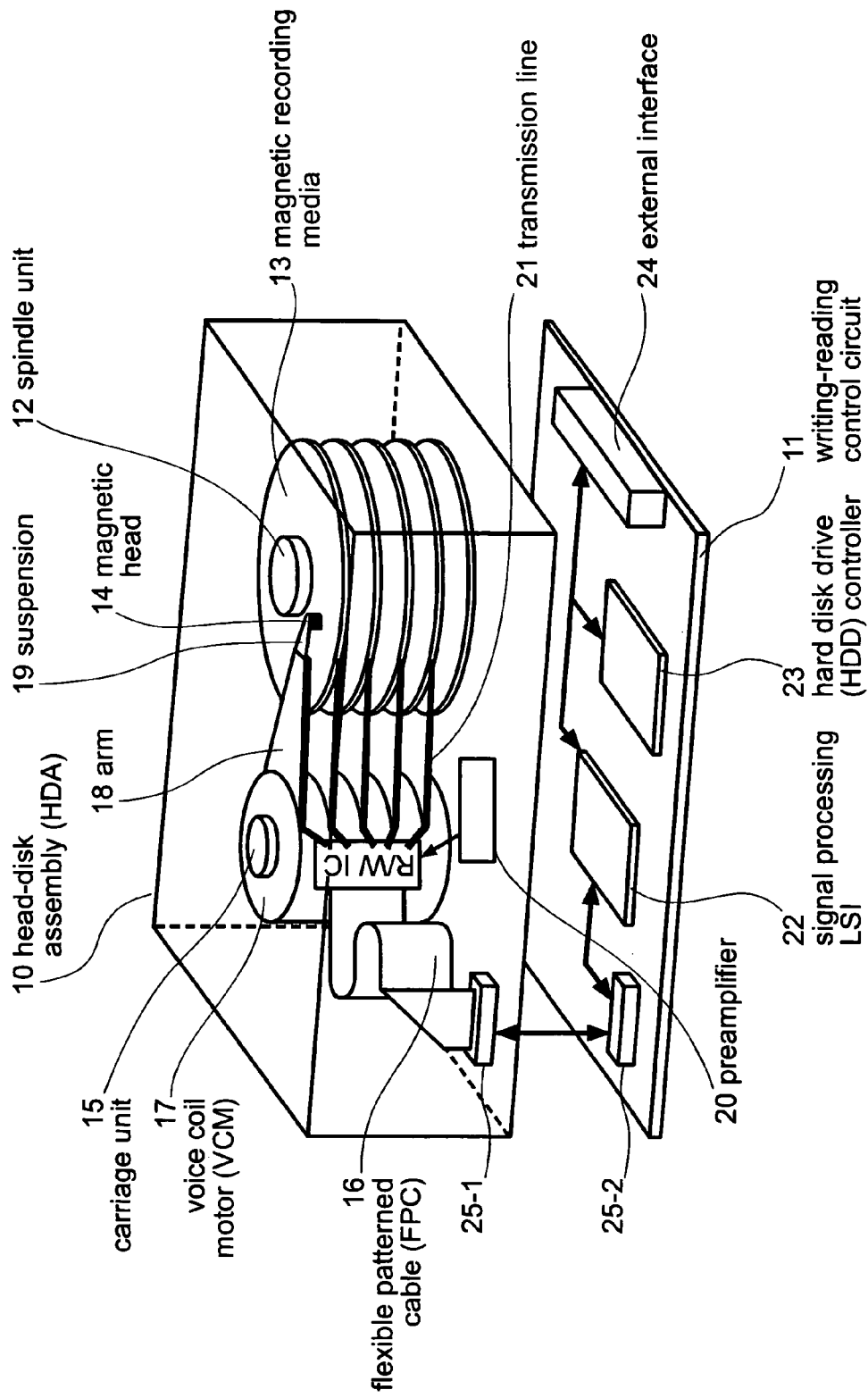
FIG. 1 is a diagram showing the structure of the magnetic disk drive according to one embodiment of the present invention.

The invention will be described below in more detail with reference to the accompanying drawings, in which like reference characters designate like or corresponding parts throughout.

FIG. 1 illustrates the construction of the magnetic disk drive according to one embodiment of the present invention. The magnetic disk drive includes a head-disk assembly (HDA) 10 and a writing-reading control circuit 11.

The HDA 10 includes a spindle unit 12 to which are attached magnetic recording media 13 in layers, and a carriage unit 15 on which are mounted magnetic heads 14 to write and read information to and from the magnetic recording media 13. They are enclosed in an aluminum base and covering.

The carriage unit 15 includes a voice coil motor (VCM) 17 which moves the magnetic heads 14 for seeking and positioning over the magnetic recording media 13, arms 18, suspensions 19 attached respectively to the forward ends of the arms 18, magnetic heads 14 attached respectively to the forward ends of the suspensions 19, a flexible patterned cable (FPC) 16, preamplifiers 20 in the R/W IC mounted on the FPC 16, and transmission lines 21 to transmit writing and reading signals between the preamplifiers 20 and the magnetic heads 14.

The HDA 10 is connected to the external unit through the writing-reading control circuit 11 (which may be placed inside the HDA 10). In the writing-reading control circuit 11 are mounted a signal processing LSI 22 and a hard disk drive (HDD) controller 23. The preamplifiers 20 are connected to the signal processing LSI 22 through a connector 25-1 (for the HDA 10) and a connector 25-2 (for the writing-reading control circuit 11) which are joined together. The writing-reading control circuit 11 is connected to an external unit through its external interface 24.

Figure 2:
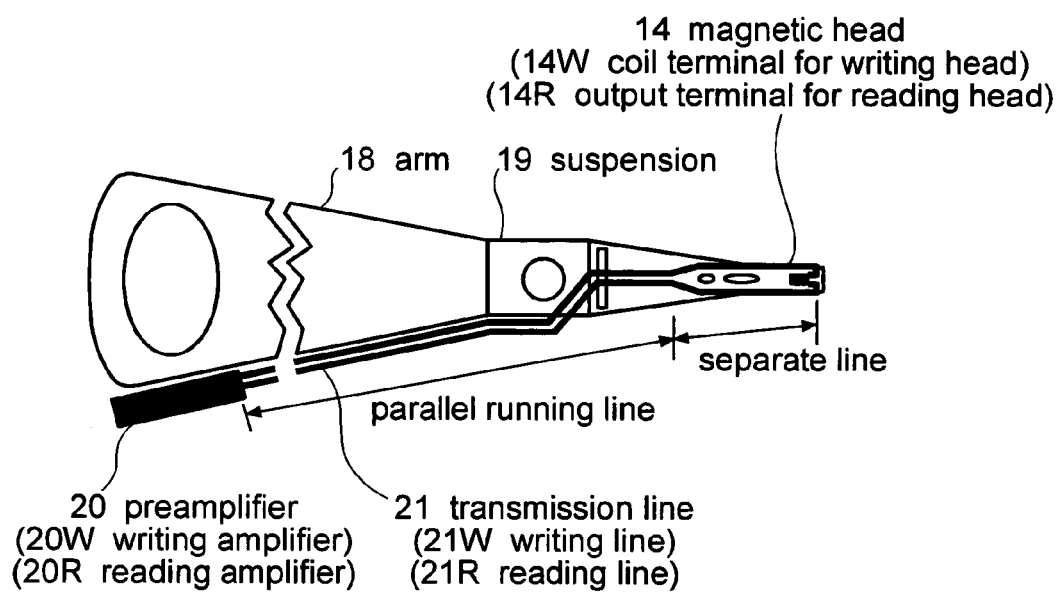
FIG. 2 is a plan view showing the arrangement of the transmission line on the arm and suspension in the magnetic disk drive according to one embodiment of the present invention.

The magnetic disk drive according to this specific embodiment of the present invention has the transmission line on the arm suspension as shown in FIG. 2. FIG. 2 is a plan view showing the arrangement of the transmission line on the arm suspension. As shown in FIG. 2, the transmission line 21 extending from the preamplifier 20 to the magnetic head 14 is arranged along the edge of the arm 18, and it is formed by printing on the suspension 19. The forward end of the printed transmission line 21 is connected to the magnetic head 14 which has a coil terminal 14W for the writing head and an output terminal 14R for the reading head. Also, the other end of the transmission line 21 is connected to the preamplifier 20 which includes a writing amplifier 20W and a reading amplifier 20R.

Figure 3:
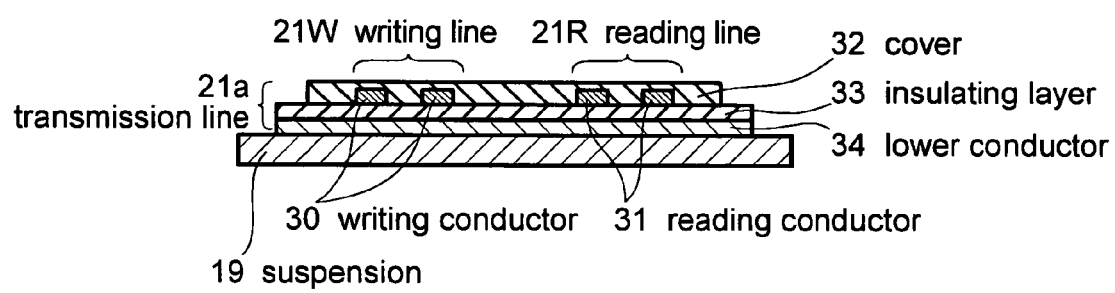
FIGS. 3a and 3b are sectional views showing the three-layer structure of the transmission line on the suspension in the magnetic disk drive according to one embodiment of the present invention.
Figure 3:
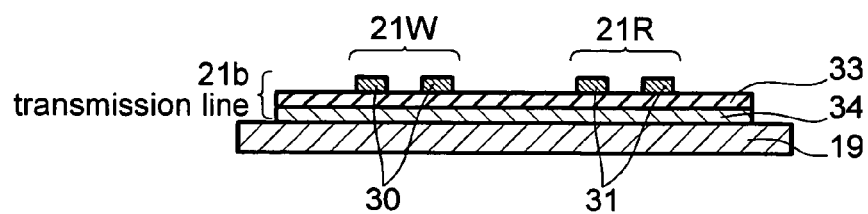
Figure 4:
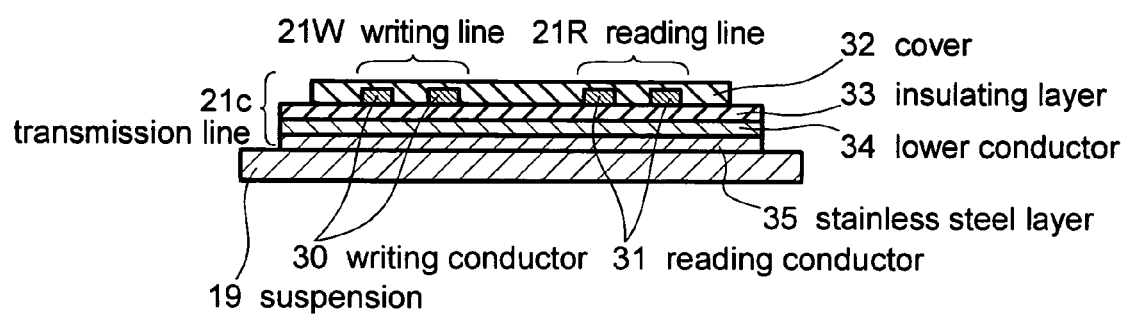
FIGS. 4a and 4b are sectional views showing the four-layer structure of the transmission line on the suspension in the magnetic disk drive according to one embodiment of the present invention.
Figure 4:
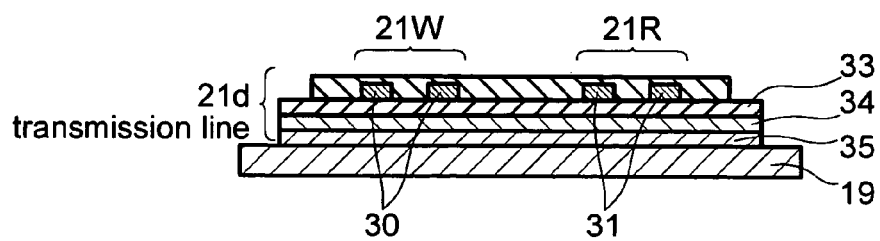
Figure 5:
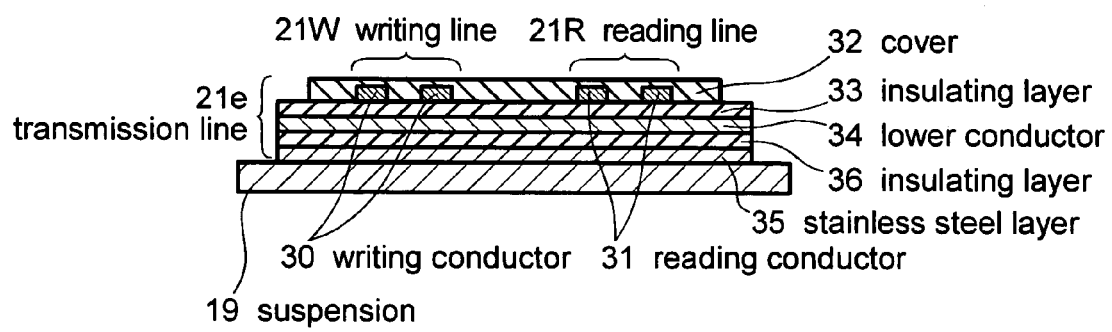
FIGS. 5a and 5b are sectional views showing the five-layer structure of the transmission line on the suspension in the magnetic disk drive according to one embodiment of the present invention.
Figure 5:
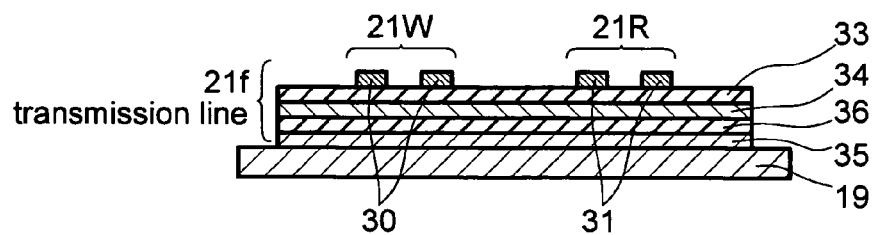

The transmission line 21 includes two parts: in one part, the writing line 21W and the reading line 21R run parallel to each other, and in the other part, they are separate from each other. The printed writing line 21W and reading line 21R (running parallel to each other) are arranged on the suspension 19 so that they are positioned relative to each other as shown in FIGS. 3 to 5 (explained later).

The magnetic disk drive mentioned above performs the writing and reading of information in the following way. In general, the writing of information is accomplished as follows. The first step is to convert information entered from the host unit into pattern data suitable for magnetic writing and reading. Then, "1" in the pattern data is made to correspond to inversion of the writing current and "0" in the pattern data is made to correspond to non-inversion of the writing current. The writing current (with inversion corresponding to the pattern data) is output from the writing amplifier 20W of the preamplifier 20 to the writing line 21W. This writing current passes through the writing line 21W and reaches the coil terminal 14W for the writing head of the magnetic head 14.

The current flows from the coil terminal 14W for the writing head to the coil to generate the writing magnetic field inside the magnetic head 14, so that it generates the writing magnetic field in the direction corresponding to its polarity. Thus, in the magnetic recording medium 13 are recorded current inversion (or magnetization reversal) corresponding to the data pattern "1" and current non-inversion (or magnetization non-reversal) corresponding to the data pattern "0".

The reading of recorded information is accomplished as follows. The reading head (MR head) in the magnetic head 14 senses the direction of magnetization of the magnetic recording medium 13 and enters the result of sensing (in terms of voltage variation) to the preamplifier 20. The preamplifier 20 sends reading signals (amplified by the reading amplifier 20R) to the channel LSI which decodes the data pattern.

Figure 6:
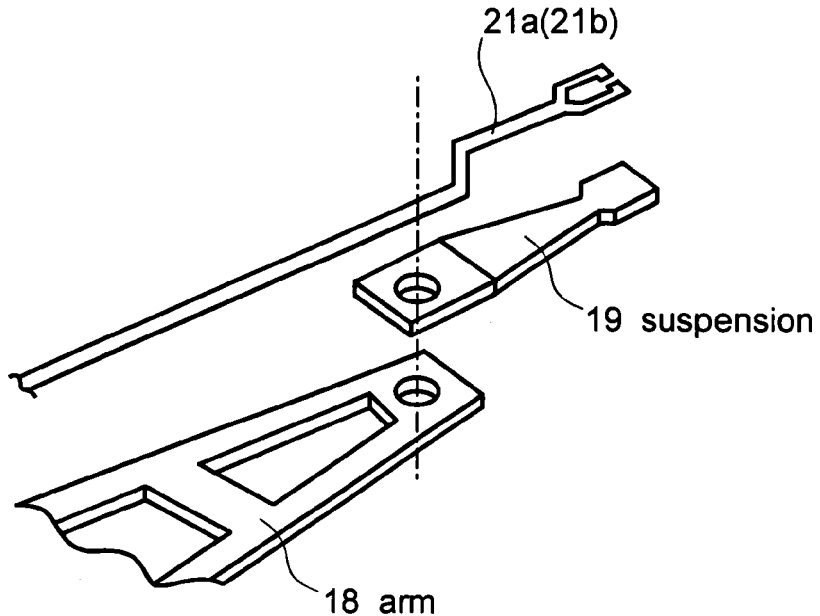
FIG. 6 is a diagram illustrating the structure of HGA (Head-Gimbal Assembly) of the example shown in FIG. 3 in the magnetic disk drive according to one embodiment of the present invention.
Figure 7:
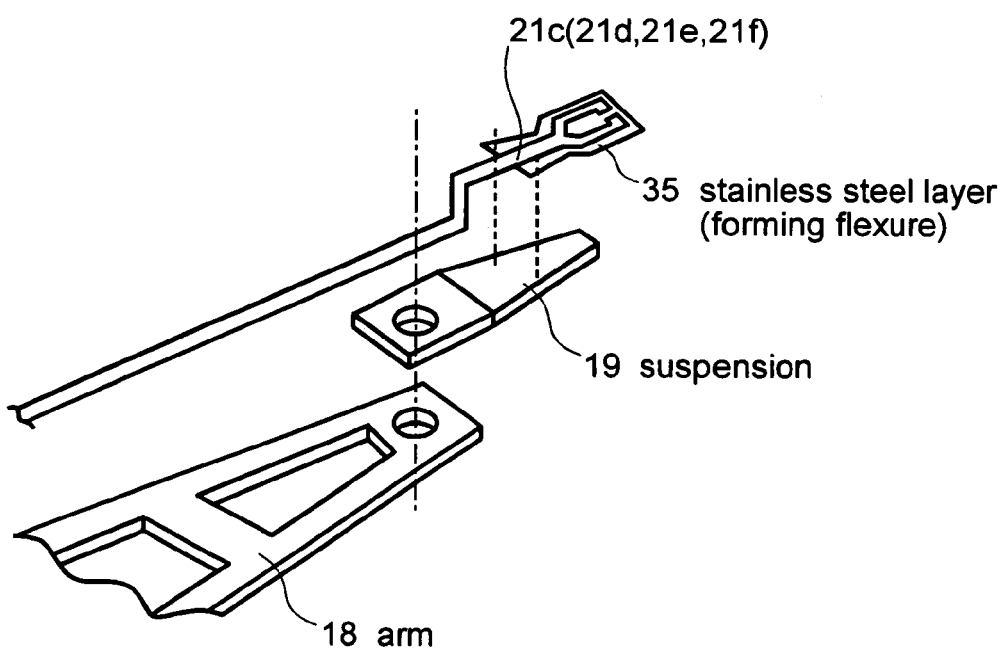
FIG. 7 is a diagram illustrating the structure of HGA of the example shown in FIGS. 4 and 5 in the magnetic disk drive according to one embodiment of the present invention.

The transmission line on the suspension is constructed as shown in FIGS. 3 to 7. FIGS. 3 to 5 are sectional views showing the structure of the transmission line on the suspension; they respectively show the three-layer structure, four-layer structure, and five-layer structure. In each figure, (a) represents the structure with a cover and (b) represents the structure without a cover. FIGS. 6 and 7 illustrate the structure of the head-gimbal assembly (HGA). FIG. 6 corresponds to FIG. 3, and FIG. 7 corresponds to FIGS. 4 and 5.

In FIG. 3(a), the transmission line 21a on the suspension includes of the writing line 21W and the reading line 21R, which are arranged a prescribed distance apart, each having of a pair of writing conductors 30 and a pair of reading conductors 31, which are formed by printing. Both the writing conductors 30 and the reading conductors 31 are arranged on the insulating layer 33 laminated on the lower conductor 34, and they are shielded by a cover 32. The cover 32 may be omitted as shown in FIG. 3(b); in this case, the uncovered transmission line is indicated by 21b.

The transmission line 21a (or 21b) has a lower conductor 34 which is formed thereunder with an insulating layer placed under the writing conductors 30 and reading conductors 31. In specific embodiments, the lower conductor 34 is made of copper or copper-based alloy about 5 µm thick. This lower conductor 34 is kept at the electrically ground potential. The insulating layer 33 is formed from polyimide resin which is about 5-10 µm thick. The suspension 19 is formed from stainless steel and the cover 32 is formed from polyimide resin.

In the case of the transmission line 21a (or 21b) of three-layer structure, which consists of the writing and reading conductors 30 and 31, the insulating layer 33, and the lower conductor 34, one end of the arm 18 is joined to one end of the suspension 19 (which is opposite to the magnetic head), as shown in FIG. 6. And, the transmission line 21a (or 21b) is mounted on the arm 18 and the suspension 19 which are joined together. The mounting of the transmission line 21a (or 21b) on the suspension 19 is accomplished by means of an adhesive. Mounting in this manner causes variation. A structure shown in FIG. 4 was configured to address this problem.

The structure shown in FIG. 3 is modified to the one as shown in FIG. 4(a). In FIG. 4(a), the transmission line 21c on the suspension 19 has an additional stainless steel layer 35 under the lower conductor 34. In the case of the transmission line 21c of four-layer structure, the stainless steel layer 35 is formed as a flexure which is integral with the suspension 19. In this structure, the cover 32 may also be omitted as shown in FIG. 4(b); in this case, the uncovered transmission line is indicated by 21d. The transmission line 21c (or 21d) includes the stainless steel layer 35 (as large as the transmission line 21c), the lower conductor 34, the insulating layer 33, the recording and reading conductors 30 and 31, and the cover 32 (which is absent for the transmission line 21d). It is cut out of a laminate sequentially formed by printing, with the stainless steel layer 35 partly left which functions as the flexure.

In the case of the transmission line 21c (or 21d), variation in the mounting can be reduced if the stainless steel layer 35 is mounted on the suspension 19 by point welding. In other words, sturdy and uniform mounting can be achieved by point welding. The mounting in this manner produces the effect of eliminating low-frequency noise because it is possible to ground the suspension 19, the weld point between the suspension 19 and the stainless steel layer 35, the stainless steel layer 35, and the lower conductor 34 in common. To ensure noise elimination, the structure may be modified as shown in FIG. 5.

As shown in FIG. 5(a), the transmission line 21e on the suspension 19 differs in structure from the transmission line 21c shown in FIG. 4, in that an additional insulating layer 36 of polyimide resin is interposed between the lower conductor 34 and the stainless steel layer 35. In the case of the transmission line 21e of five-layer structure shown in FIG. 7, the stainless steel layer 35 is also formed as a flexure which is integral with the suspension 19, as in the case of FIG. 4. In this structure, too, the cover 32 may be omitted as shown in FIG. 5(b); in this case, the uncovered transmission line is indicated by 21f. This transmission line 21e (or 21f) may also be formed in the same way as in the case shown in FIG. 4.

In the case of the transmission line 21e (or 21f), the lower conductor 34 can be isolated from ground if the insulating layer 36 is interposed between the lower conductor 34 and the stainless steel layer 35 and the stainless steel layer 35 is mounted on the suspension 19 by point welding. Point welding achieves sturdy and uniform mounting. Moreover, isolating the lower conductor 34 from ground precludes low-frequency noise.

Figure 8:
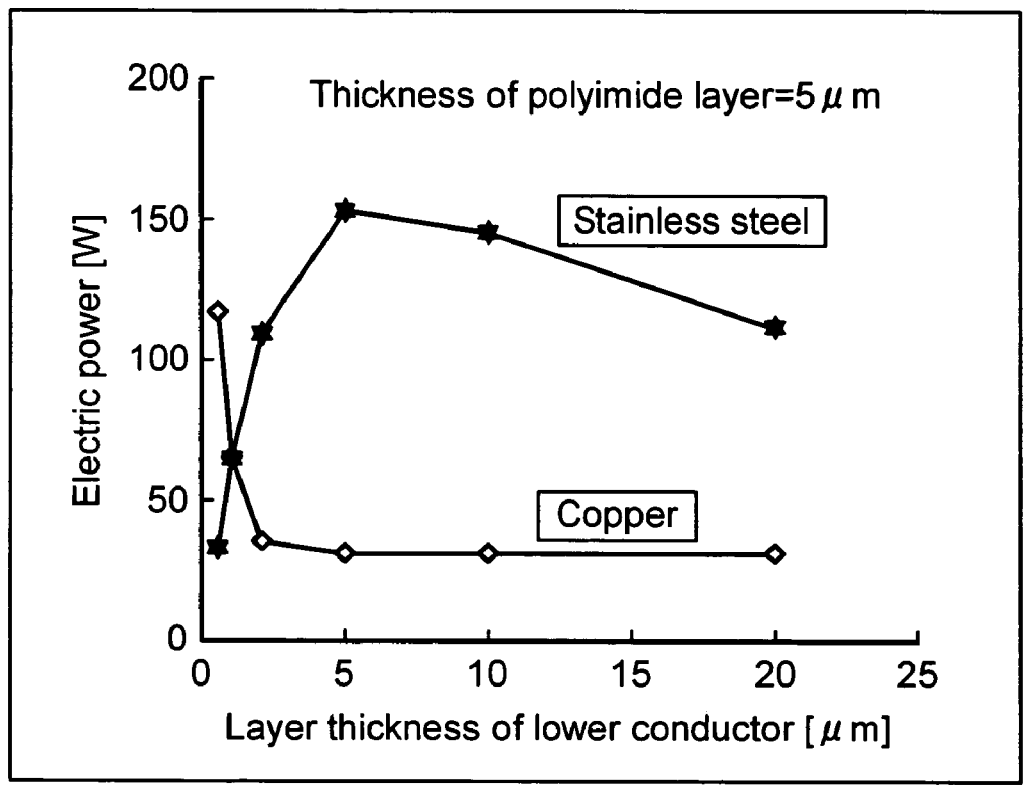
FIG. 8 is a diagram showing the relation between the layer thickness of the lower conductor and the change in electric power (with the layer thickness of polyimide resin being 5 µm) in the magnetic disk drive according to one embodiment of the present invention.
Figure 9:
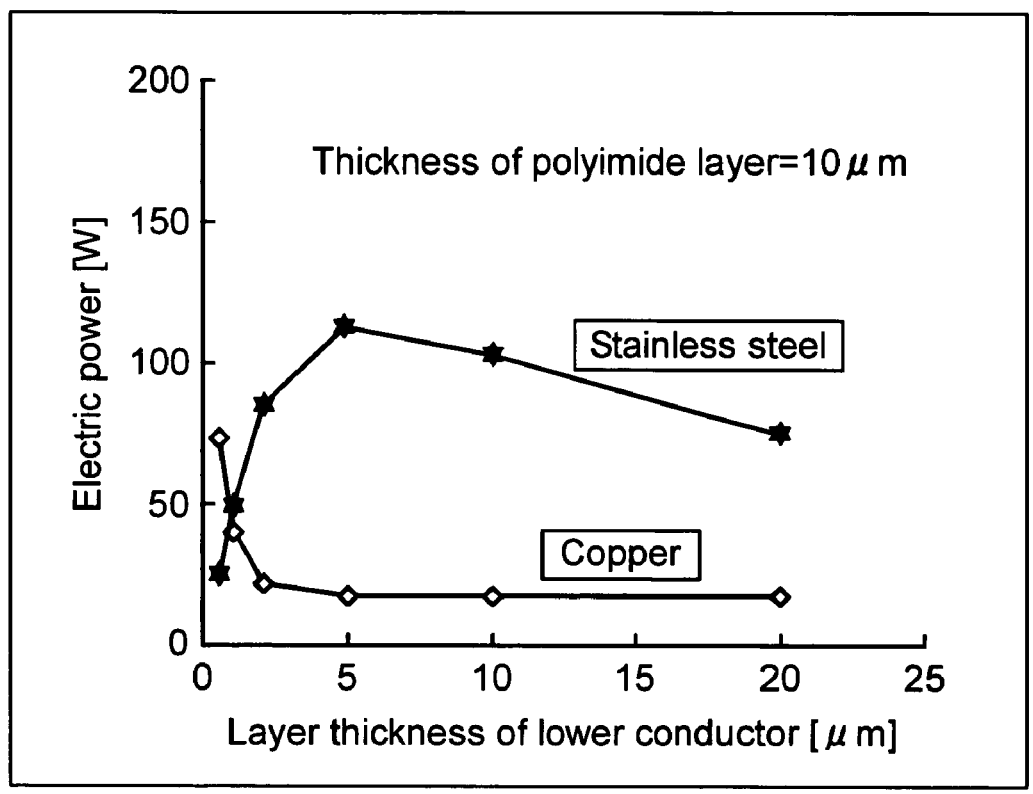
FIG. 9 is a diagram showing the relation between the layer thickness of the lower conductor and the change in electric power (with the layer thickness of polyimide resin being 10 µm) in the magnetic disk drive according to one embodiment of the present invention.
Figure 10:
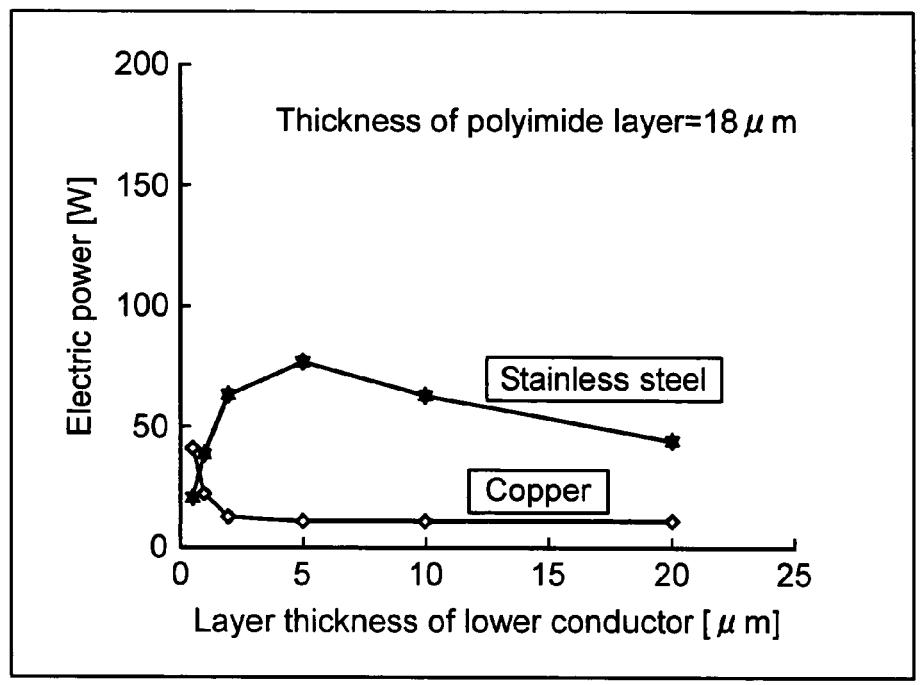
FIG. 10 is a diagram showing the relation between the layer thickness of the lower conductor and the change in electric power (with the layer thickness of polyimide resin being 18 µm) in the magnetic disk drive according to one embodiment of the present invention.

Power consumption varies depending on the thickness of the copper or stainless steel conductor under the transmission line. FIGS. 8 to 10 show the dependence of power consumption on thickness which was obtained by simulation. The insulating layer of polyimide resin was assumed to have a thickness of 5 μm, 10 μm, and 18 μm, respectively, in the simulation tests shown in FIGS. 8, 9, and 10.

FIG. 8 shows the result of the simulation test in which the insulating layer 33 of polyimide resin has a thickness of 5 μm. In the case where the lower conductor 34 is formed from copper (having a conductivity of σ=5.8×10$^7$ S/m), it is noted from FIG. 8 that power consumption decreases from about 120 W to about 35 W and further to about 30 W as the thickness of the lower conductor increases from about 0.5 μm to about 2 μm and further to about 5 μm. Power consumption levels off beyond the thickness of about 5 μm. By contrast, in the case where the lower conductor 34 is formed from stainless steel (having a conductivity of σ=1.1×10$^6$ S/m), it is noted from FIG. 8 that power consumption increases and then decreases (about 30 W, 100 W, 150 W, 140 W, 110 W) as the thickness of the lower conductor increases (about 0.5 μm, 2 μm, 5 μm, 10 μm, 20 μm). The foregoing results suggest that the lower conductor of copper permits power consumption to be reduced even if the layer thickness is larger than 2 μm. In the case of the lower conductor of stainless steel, power consumption is low if the layer thickness is small; however, stainless steel cannot be used as the transmission line for the reasons given below.

FIG. 9 shows the results of the simulation test in which the insulating layer 33 of polyimide has a thickness of 10 μm. It is noted from FIG. 9 that power consumption is reduced more than in the case shown in FIG. 8. That is, power consumption for the lower conductor 34 of copper is reduced to about 25 W if the layer thickness is larger than about 2 μm. The reduction of power consumption is not achieved in the case of the lower conductor made of stainless steel.

FIG. 10 shows the results of the simulation test in which the insulating layer 33 of polyimide has a thickness of 18 μm. It is noted from FIG. 10 that power consumption is reduced to about 10 W if the lower conductor 34 is formed from copper and has a layer thickness of about 2 μm.

The foregoing results suggest that power consumption can be reduced even though the layer thickness is reduced so long as the lower conductor 34 is formed from copper in place of stainless steel. This leads to a reduction of transmission loss in the transmission line.

Figure 11:
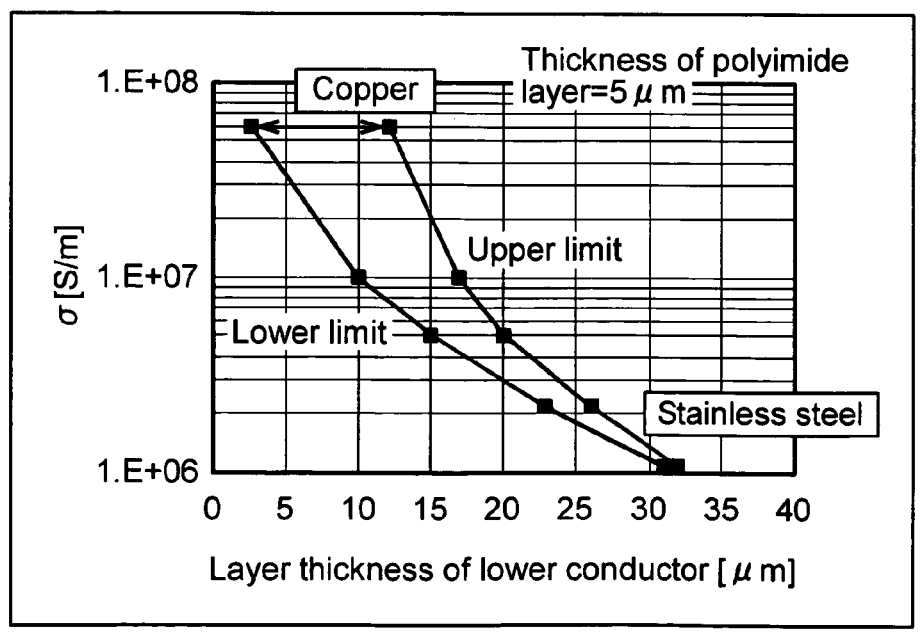
FIG. 11 is a diagram showing the relation between the conductivity of the lower conductor and the layer thickness (with the layer thickness of polyimide resin being 5 µm) in the magnetic disk drive according to one embodiment of the present invention.
Figure 12:
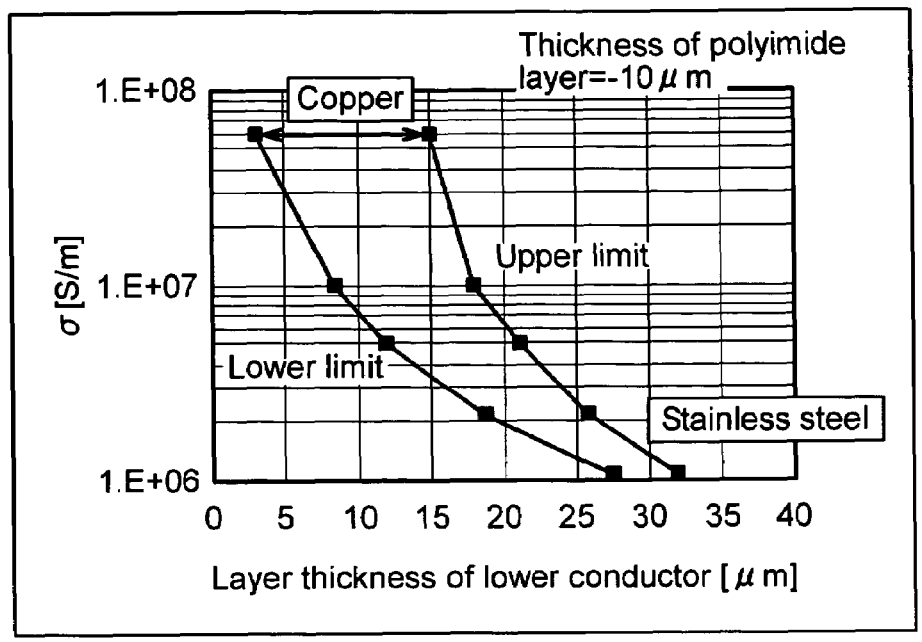
FIG. 12 is a diagram showing the relation between the conductivity of the lower conductor and the layer thickness (with the layer thickness of polyimide resin being 10 µm) in the magnetic disk drive according to one embodiment of the present invention.
Figure 13:
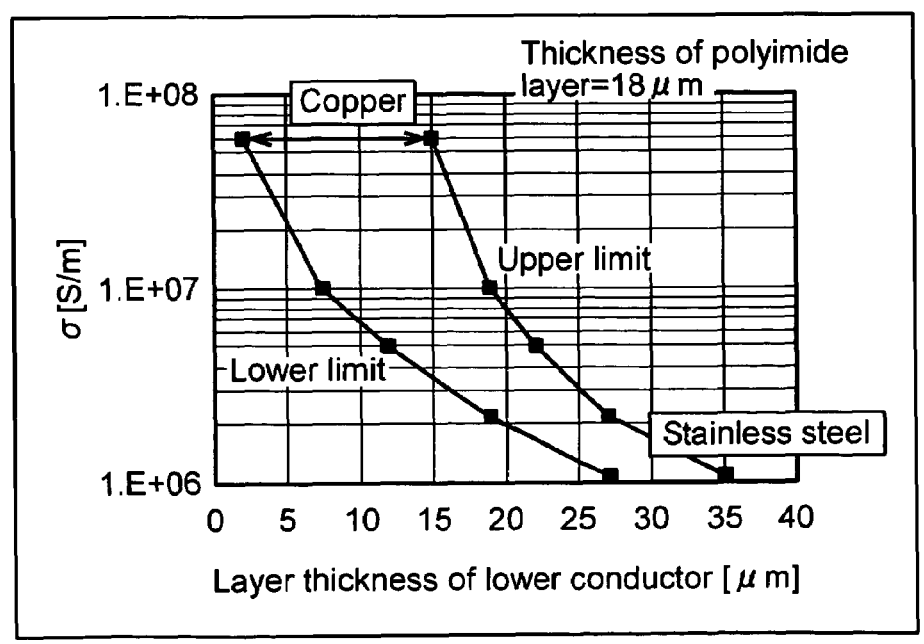
FIG. 13 is a diagram showing the relation between the conductivity of the lower conductor and the layer thickness (with the layer thickness of polyimide resin being 18 µm) in the magnetic disk drive according to one embodiment of the present invention.

The lower conductor of the transmission line, which is formed from copper or stainless steel, varies in power consumption depending on the layer thickness and the conductivity. FIGS. 11 to 13 show the dependence of power consumption on thickness and conductivity which was obtained by simulation. The insulating layer of polyimide resin was assumed to have a thickness of 5 μm, 10 μm, and 18 μm, respectively, in the simulation tests shown in FIGS. 11, 12, and 13.

FIG. 11 shows the result of the simulation test in which the insulating layer 33 of polyimide resin has a thickness of 5 μm. In the case where the lower conductor 34 is formed from copper (having a conductivity of σ=5.8×10$^7$ S/m), it is noted from FIG. 11 that the power consumption of the lower conductor 34 reaches a minimum while the layer thickness ranges from about 2 μm to about 12 μm. The lower limit and the upper limit of the layer thickness are determined by the method explained later with reference to FIG. 14. By contrast, in the case where the lower conductor 34 is formed from stainless steel (having a conductivity of σ=1.1×10$^6$ S/m), it is noted from FIG. 11 that the power consumption of the lower conductor 34 reaches a minimum when the layer thickness is about 31 μm. The foregoing suggests that power consumption is minimized if the layer thickness is about 2-12 μm in the case where the lower conductor is formed from copper in place of stainless steel.

FIGS. 12 and 13 respectively show the results of the simulation test in which the insulating layer 33 of polyimide resin is 10 μm thick and 18 μm thick. The results suggest that power consumption is minimized if the layer thickness is about 2-15 μm in the case where the lower conductor is formed from copper in place of stainless steel.

Figure 14:
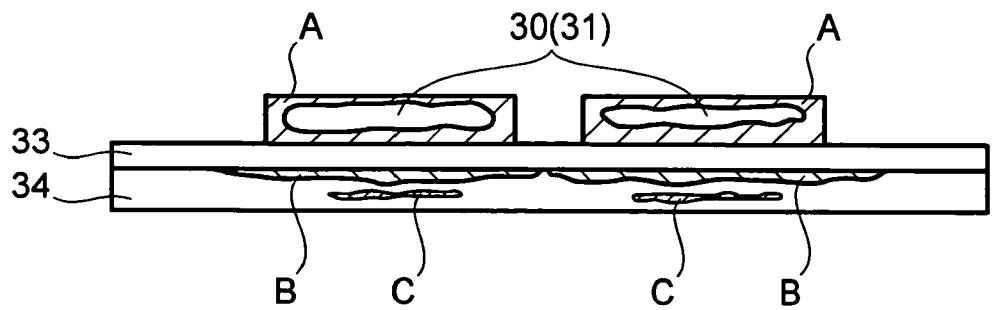
FIG. 14 is a diagram illustrating how induced current occurs in the lower conductor when a high-frequency current is applied to the conductor of the transmission line in the magnetic disk drive according to one embodiment of the present invention.

Discussed below is the method for determining by simulation the upper and lower limits of the layer thickness at which the power consumption of the lower conductor is a minimum. FIG. 14 illustrates how high-frequency current flowing through the conductor of the transmission line induces current in the lower conductor.

In FIG. 14, there are shown a pair of writing conductors 30 or a pair of reading conductors 31. It is assumed that a 1-GHz current (differential current) is applied to the writing conductors 30 or the reading conductors 31 such that the left conductor permits the current to flow out of the page and the right conductor permits the current to flow into the page. There is also shown the lower conductor 34 formed from copper having a conductivity of σ=5.8×10$^7$S/m.

FIG. 14 shows that the high-frequency current (1 GHz) applied to the transmitting conductor (such as the paired writing conductors 30) concentrates at the surface of the conductor (indicated by part A). The current flowing through the transmitting conductor causes an induced current to flow through the lower conductor 34 facing to it, with the insulating layer 33 interposed between them. The direction of the induced current is opposite to the current flowing through the transmitting conductor. The induced current exists more in the part closer to the transmitting conductor.

The lower conductor 34 shown in FIG. 14 has a rather large thickness of 10 μm. The induced current flowing through the thick lower conductor 34 concentrates at the part (indicated by B) close to the transmitting conductor. At the same time, the induced current also flows (in the opposite direction) through the lower part (indicated by C). The induced current flowing through part C is defined as the secondary induced current.

In the case where the lower conductor 34 is thin (e.g., 5 μm), the induced current (which is induced by current flowing through the transmitting conductor) flows through the part close to the transmitting conductor of the lower conductor 34, as in the case where the lower conductor 34 is thick. However, since the lower conductor 34 is thin, the induced current flows over the entire surface of the lower conductor 34 and no secondary induced current flows because there exists no region for the secondary induced current to flow.

The transmission loss that occurs in the lower conductor 34 is defined herein as power loss that occurs in the lower conductor 34. (Power loss is equal to energy consumed by the lower conductor 34.) The square of current (i) in an infinitesimal region multiplied by the resistance (r) in an infinitesimal region equals the power (p) consumed in an infinitesimal region. The integral of p over the entire region of volume of the lower conductor 34 is the total power (P) consumed.

Consequently, the secondary induced current causes power consumption in proportion to its amount. The upper limit of the thickness of the lower conductor 34 is the thickness at which the secondary induced current begins to flow when the thickness of the lower conductor 34 is gradually increased.

Conversely, as the thickness of the lower conductor 34 decreases, the induced current does not flow any longer because there exists no region for the induced current proportional to the current flowing through the transmitting conductor. The absence of induced current reduces power consumption, but the insufficient induced current reduces coupling between the high-frequency current and the induced current. This results in a smaller mutual inductance between the transmission conductors, which in turn equivalently increases the characteristic impedance of the line. In other words, there occurs a situation in which current bypasses the line having a different characteristic impedance in the high-frequency signal region of the transmission line. This causes transmission distortion. Therefore, the lower conductor 34 with a small thickness is not desirable because of its poor transmission characteristics although it reduces power consumption. Thus, the lower limit of the thickness of the lower conductor 34 is the thickness at which power consumption reaches a peak.

It is noted from FIG. 14 that the induced current expands in the widthwise direction more than the width of the line conductor. The results of simulation tests show that the induced current extends beyond the end of the conductor as far as half the width of the distance between the conductors. Therefore, the width of the lower conductor should be larger than at least the sum of the width of the paired conductors and the distance between the paired conductors. Twice the width of the paired conductors will be sufficient.

An investigation was carried out by simulation on the relation between the minimum power consumption and the conductivity of the lower conductor which depends on the thickness of the insulating layer of polyimide resin. The result is illustrated in FIG. 15.

Figure 15:
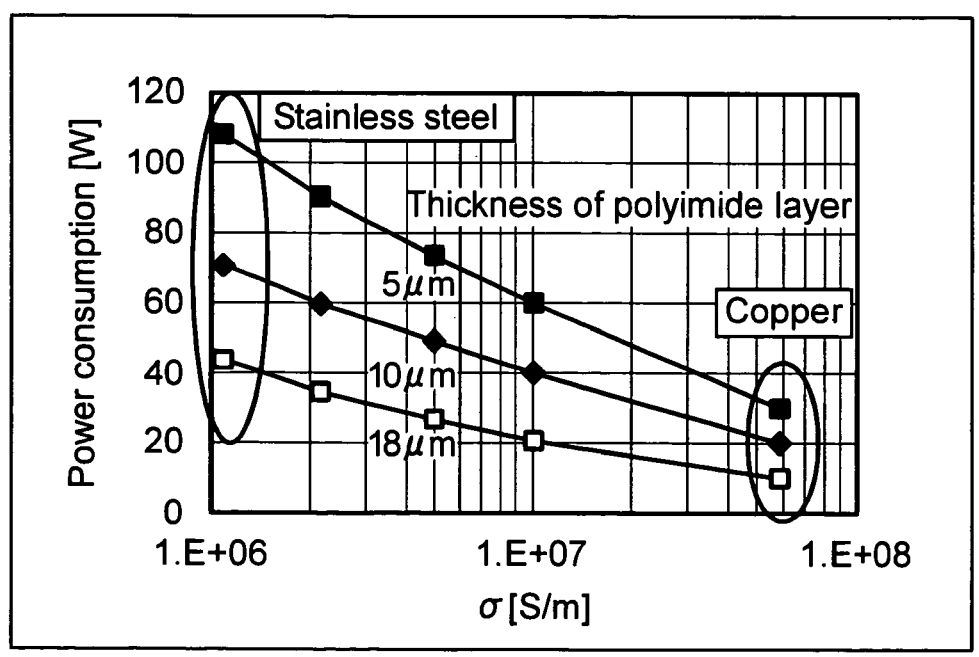
FIG. 15 is a diagram illustrating the relation between the conductivity of the lower conductor and the minimum power consumption in the magnetic disk drive according to one embodiment of the present invention.

It is noted from FIG. 15 that if the insulating layer 33 of polyimide resin has a thickness of 5 μm, the lower conductor 34 of stainless steel (having a conductivity of $\sigma=1.1 \times 10^6$ S/m) consumes a power of about 110 W, whereas the lower conductor 34 of copper (having a conductivity of $\sigma=5.8\times10^7$ S/m) consumes a power of only about 30 W.

Similarly, in the case where the insulating layer 33 has a thickness of 10 μm, power consumption is reduced from about 70 W to about 20 W. In the case where the insulating layer 33 has a thickness of 10 μm, power consumption is reduced from about 45 W to about low.

It is concluded from the results of simulation tests shown in FIGS. 8 to 15 that the lower conductor 34 of copper with a layer thickness of 5 μm has a lower transmission loss as compared with the conventional one formed from stainless steel with a thickness of 25 μm. Incidentally, according to the results of simulation tests, the effect of reducing transmission loss will be produced even though the layer thickness of copper ranges over about 2-12 μm.

If the thickness of the insulating layer 33, which determines the distance between the lower conductor 34 and the writing and reading conductors 30 and 31, is reduced to 5-10 μm from the conventional thickness of 10 μm, transmission loss increases but the rigidity of the transmission line decreases because the line thickness decreases. Therefore, such a transmission line can be applied to wiring around the head. In addition, it eliminates impedance mismatch in the line around the head. This permits the transmission band to be expanded.

The magnetic disk drive according to the specific embodiment of the present invention produces the following effects.

(1) In the case where the transmission lines 21a and 21b on the suspension 19 are of three-layer structure consisting of a writing conductor 30, a reading conductor 31, an insulating layer 33, and a lower conductor 34, the lower conductor 34 can be formed from copper so that power consumption (due to induced current of the lower conductor 34) is reduced and hence the transmission loss of the line is reduced. Moreover, the thickness of the line is reduced and hence the rigidity of the wiring around the head is reduced.

(2) In the case where the transmission lines 21c and 21d on the suspension 19 are of four-layer structure consisting of a writing conductor 30, a reading conductor 31, an insulating layer 33, a lower conductor 34, and a stainless steel layer 35, the following additional effect is produced. Sturdy and uniform mounting can be achieved by joining together the stainless steel layer 35 and the suspension 19 by point welding. Moreover, the suspension 19, the stainless steel layer 35, and the lower conductor 34 are grounded in common so that low-frequency noise is eliminated.

(3) In the case where the transmission lines 21e and 21f on the suspension 19 are of five-layer structure consisting of a writing conductor 30, a reading conductor 31, an insulating layer 33, a lower conductor 34, an insulating layer 36, and a stainless steel layer 35, the following additional effect is produced. Sturdy and uniform mounting can be achieved by joining together the stainless steel layer 35 and the suspension 19 by point welding, with an insulating layer 36 interposed under the lower conductor 34. Moreover, the lower conductor 34 is isolated from ground so that low-frequency noise can be precluded.

According to the present invention, it is possible to reduce transmission loss in the transmission line, thereby improving its electrical properties, and it is also possible to reduce rigidity in wiring around the head, thereby improving its vibration characteristics. Both the improved electrical properties and the improved vibration characteristics permits the transmission line to have a flat impedance.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A magnetic disk drive, comprising:
   a magnetic head for writing and reading information to and from a magnetic recording medium;
   a transmission line for transmitting writing and reading information to and from the magnetic head; and
   a suspension on which the transmission line is mounted, the suspension being coupled with the magnetic head,
   wherein said transmission line mounted on said suspension includes a pair of conductors as the writing line and a pair of conductors as the reading line, a lower conductor disposed underneath each of the writing line and reading line, and a first insulating layer interposed between said lower conductor and said writing and reading lines, and
   wherein the lower conductor has a stainless steel layer as a flexure formed thereunder integrally with the suspension,
   wherein a second insulating layer is interposed between the lower conductor and the stainless steel layer,
   wherein the suspension, the weld point, the stainless steel layer, and the lower conductor are grounded.

2. The magnetic disk drive as recited in claim 1, wherein the first insulating layer is formed from polyimide resin which is 5-10 μm thick.

3. The magnetic disk drive as recited in claim 1, wherein the lower conductor is electrically kept at the ground potential.

4. The magnetic disk drive as recited in claim 1, wherein the stainless steel layer is mounted on the suspension by a weld point.

5. The magnetic disk drive as recited in claim 1, wherein the lower conductor has a thickness of 2-12 μm.

6. A magnetic disk drive comprising:
a suspension;
a magnetic head coupled with the suspension and configured to write and read information to and from a magnetic recording medium; and
a transmission line disposed on the suspension to transmit writing and reading information to and from the magnetic head, the transmission line including a writing line and a reading line, a lower conductor disposed underneath the writing line and the reading line, and a first insulating layer interposed between the lower conductor and the writing and reading lines,
wherein the lower conductor has a stainless steel layer as a flexure formed thereunder integrally with the suspension,
wherein a second insulating layer is interposed between the lower conductor and the stainless steel layer,
wherein the suspension, the weld point, the stainless steel layer, and the lower conductor are grounded.

7. The magnetic disk drive as recited in claim 6, wherein the writing line comprises a pair of conductors and the reading line comprises a pair of conductors.

8. The magnetic disk drive as recited in claim 6, wherein the transmission line is spaced from the lower conductor by 5-10 μm.

9. The magnetic disk drive as recited in claim 6, wherein the first insulating layer comprises polyimide resin and has a thickness of 5-10 μm.

10. A magnetic disk drive comprising:
a suspension;
a magnetic head coupled with the suspension and configured to write and read information to and from a magnetic recording medium; and
a transmission line disposed on the suspension to transmit writing and reading information to and from the magnetic head, the transmission line including a writing line and a reading line, a lower conductor disposed underneath the writing line and the reading line, and a first insulating layer interposed between the lower conductor and the writing and reading lines, wherein the lower conductor comprises copper or copper-based alloy;
wherein a stainless steel layer which is disposed under the lower conductor and coupled with the suspension,
wherein a second insulating layer is interposed between the lower conductor and the stainless steel layer,
wherein the suspension, the stainless steel layer, and the lower conductor are grounded.

11. The magnetic disk drive as recited in claim 10, wherein the stainless steel layer is formed as a flexure integrally with the suspension.

12. The magnetic disk drive as recited in claim 10, wherein the stainless steel layer is connected to the suspension by a weld point.

13. The magnetic disk drive as recited in claim 10, wherein the lower conductor has a thickness of 2-12 μm.

14. The magnetic disk drive as recited in claim 10, wherein the first insulating layer comprises polyimide resin and has a thickness of 5-10 μm.

* * * * *